(12) United States Patent
Wang et al.

(10) Patent No.: US 12,022,719 B2
(45) Date of Patent: Jun. 25, 2024

(54) DISPLAY SUBSTRATE AND DISPLAY APPARATUS

(71) Applicant: BOE TECHNOLOGY GROUP CO., LTD., Beijing (CN)

(72) Inventors: Lei Wang, Beijing (CN); Xiaoliang Ding, Beijing (CN); Xiaoquan Hai, Beijing (CN); Yangbing Li, Beijing (CN); Lei Zhang, Beijing (CN); Yingzi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,723

(22) PCT Filed: Apr. 13, 2021

(86) PCT No.: PCT/CN2021/086766
§ 371 (c)(1),
(2) Date: Mar. 31, 2022

(87) PCT Pub. No.: WO2021/233014
PCT Pub. Date: Nov. 25, 2021

(65) Prior Publication Data
US 2022/0367582 A1  Nov. 17, 2022

(30) Foreign Application Priority Data
May 18, 2020 (CN) .......................... 202010421935.2

(51) Int. Cl.
*H10K 59/60* (2023.01)
*G06V 40/13* (2022.01)
(Continued)

(52) U.S. Cl.
CPC ......... *H10K 59/60* (2023.02); *G06V 40/1318* (2022.01); *H10K 59/122* (2023.02); *H10K 59/40* (2023.02); *H10K 59/65* (2023.02)

(58) Field of Classification Search
None
See application file for complete search history.

(56) References Cited

U.S. PATENT DOCUMENTS

2018/0175125 A1* 6/2018 Chung ................... G06V 40/12
2019/0050621 A1* 2/2019 Xu ..................... G06V 40/1318
(Continued)

FOREIGN PATENT DOCUMENTS

CN       106096595 A    11/2016
CN       107122750 A     9/2017
(Continued)

*Primary Examiner* — Benjamin X Casarez
(74) *Attorney, Agent, or Firm* — IP & T GROUP LLP

(57) ABSTRACT

A display substrate includes a substrate, a plurality of photosensitive sensors disposed on a side of the substrate, and a first light guide layer disposed on a side of the plurality of photosensitive sensors away from the substrate. A material of the first light guide layer includes a light-shielding material. The first light guide layer is provided with a plurality of first through holes, and an orthographic projection of at least one first through hole on the substrate is located within a range of an orthographic projection of a photosensitive sensor of the plurality of first through holes on the substrate.

13 Claims, 9 Drawing Sheets

(51) Int. Cl.
*H10K 59/122* (2023.01)
*H10K 59/40* (2023.01)
*H10K 59/65* (2023.01)

(56) References Cited

U.S. PATENT DOCUMENTS

| | | | |
|---|---|---|---|
| 2019/0065809 A1 | 2/2019 | Li et al. | |
| 2019/0179488 A1* | 6/2019 | Klenkler | G06F 3/0421 |
| 2019/0205603 A1* | 7/2019 | Lee | G06V 40/1329 |
| 2019/0213379 A1* | 7/2019 | Zhao | H10K 59/122 |
| 2019/0236327 A1 | 8/2019 | Jia et al. | |
| 2020/0026898 A1 | 1/2020 | Fan et al. | |
| 2020/0026899 A1* | 1/2020 | Sun | H10K 59/126 |
| 2020/0034600 A1* | 1/2020 | Chan | G06F 3/0412 |
| 2020/0065545 A1* | 2/2020 | Ahn | G06V 40/1318 |
| 2020/0403168 A1* | 12/2020 | Li | H10K 77/10 |
| 2021/0020710 A1* | 1/2021 | Park | G06V 40/1318 |
| 2021/0097252 A1* | 4/2021 | Lee | G06V 40/1318 |
| 2021/0151524 A1* | 5/2021 | Tang | G06V 40/1318 |
| 2021/0397806 A1* | 12/2021 | Lu | G06F 3/0412 |
| 2023/0096025 A1* | 3/2023 | Li | H10K 59/122 |
| | | | 382/124 |

FOREIGN PATENT DOCUMENTS

| | | | | |
|---|---|---|---|---|
| CN | 108288681 A | * | 7/2018 | G06F 3/0412 |
| CN | 110175492 A | | 8/2019 | |

\* cited by examiner

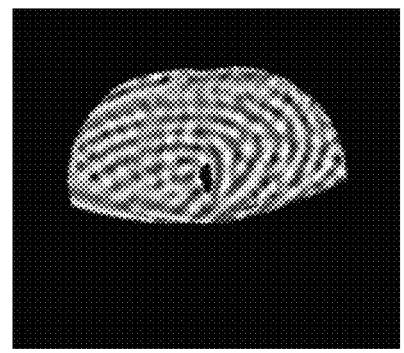
FIG. 1
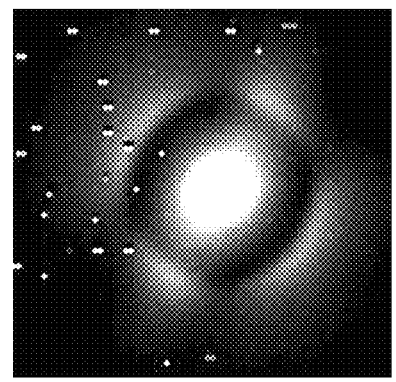
FIG. 2
FIG. 3

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2021/086766 filed on Apr. 13, 2021, which claims priority to Chinese Patent Application No. 202010421935.2, filed on May 18, 2020, which are incorporated herein by reference in their entirety.

TECHNICAL FIELD

The present disclosure relates to the field of display technologies, and in particular, to a display substrate and a display apparatus.

BACKGROUND

With the development of science and technology, fingerprint sensing technologies are more and more widely used in daily life.

According to principles of fingerprint imaging, the fingerprint sensing technologies may be classified into an optical fingerprint sensing technology, a semiconductor capacitive fingerprint sensing technology, a semiconductor thermosensitive fingerprint sensing technology, a semiconductor pressure sensitive fingerprint sensing technology, an ultrasonic fingerprint sensing technology, etc. The optical fingerprint sensing technology is a technology that mainly obtains texture of a finger by acquiring signals of reflected light (i.e., light reflected by the finger) after the light is incident on the finger.

SUMMARY

In an aspect, a display substrate is provided. The display substrate includes a substrate, a plurality of photosensitive sensors disposed on a side of the substrate, and a first light guide layer disposed on a side of the plurality of photosensitive sensors away from the substrate. A material of the first light guide layer includes a light-shielding material. The first light guide layer is provided with a plurality of first through holes therein, and an orthogonal projection of at least one first through hole on the substrate is located within a range of an orthographic projection of a photosensitive sensor of the plurality of photosensitive sensors on the substrate.

In some embodiments, the display substrate further includes a planarization layer, an electrode layer and a pixel defining layer that are sequentially disposed on the side of the plurality of photosensitive sensors away from the substrate. The first light guide layer includes at least one of the planarization layer, the electrode layer or the pixel defining layer.

In some embodiments, the display substrate further includes a spacer layer disposed on a side of the pixel defining layer away from the substrate. The first light guide layer further includes the spacer layer.

In some embodiments, the first light guide layer includes the planarization layer, the pixel defining layer and the spacer layer; the plurality of first through holes penetrate the planarization layer, the pixel defining layer and the spacer layer.

In some embodiments, the display substrate further includes a planarization layer, an electrode layer, a pixel defining layer and a spacer layer that are sequentially disposed on the side of the plurality of photosensitive sensors away from the substrate. The first light guide layer includes the spacer layer.

In some embodiments, in a case where the first light guide layer includes the electrode layer, and the plurality of first through holes penetrate the electrode layer, an orthographic projection of each photosensitive sensor on the substrate is located within a range of an outer boundary of an orthographic projection of a portion of the electrode layer corresponding to the photosensitive sensor on the substrate. In a case where first light guide layer does not include the electrode layer, the orthographic projection of each photosensitive sensor on the substrate partially overlaps with the orthographic projection of the electrode layer on the substrate, and an orthogonal projection of each first through hole on the substrate is non-overlapping with the orthographic projection of the electrode layer on the substrate.

In some embodiments, the display substrate has a plurality of sub-pixels. Each sub-pixel includes a light-emitting device, and the light-emitting device includes a light-emitting layer. The pixel defining layer has a plurality of first openings, and each first opening is provided with a light-emitting layer therein. Each photosensitive sensor is configured to acquire light that is emitted by at least one light-emitting device and reflected by a finger.

In some embodiments, the spacer layer includes a plurality of spacers. An orthographic projection of each spacer on the substrate is located within a range of an orthographic projection of the pixel defining layer on the substrate; and an orthographic projection of each photosensitive sensor on the substrate is located within a range of an orthographic projection of a respective one of the plurality of spacers on the substrate.

In some embodiments, 2 to 100 first through holes of the plurality of first through holes are provided in a portion of the first light guide layer facing each photosensitive sensor.

In some embodiments, a diameter of a first through hole of the 2 to 100 first through holes is within a range of 2 μm to 10 μm, inclusive.

In some embodiments, the display substrate further includes an encapsulation layer disposed on a side of the first light guide layer away from the substrate, and a second light guide layer disposed on a side of the encapsulation layer away from the substrate. The second light guide layer is configured to adjust light passing through the second light guide layer to exit light at an exit angle within a preset range.

In some embodiments, a material of the second light guide layer includes a light-shielding material. The second light guide layer is provided with a plurality of second through holes therein. An orthogonal projection of a first through hole of the plurality of first through holes on the substrate at least partially overlaps with an orthogonal projection of a respective second through hole of the plurality of second through holes on the substrate. The orthogonal projection of the first through hole and the orthogonal projection of the respective second through hole are within a range of an orthographic projection of a same photosensitive sensor on the substrate.

In some embodiments, the display substrate further includes a pixel defining layer, and an orthographic projection of the second light guide layer on the substrate is located within a range of an orthographic projection of the pixel defining layer on the substrate.

In some embodiments, the second light guide layer is provided with a plurality of second through holes therein, the plurality of first through holes and the plurality of second through holes are filled with respective light-transmissive materials.

In some embodiments, a thickness of the encapsulation layer is within a range of 6 μm to 12 μm, inclusive.

In some embodiments, the second light guide layer is provided with a plurality of second openings therein, and an orthogonal projection of each second opening on the substrate is not overlapping with an orthographic projection any one of the plurality of photosensitive sensors on the substrate. The display substrate further includes a color filter portion disposed in each second opening.

In some embodiments, the display substrate further includes a polarizer disposed on a side of the second light guide layer away from the substrate.

In some embodiments, the display substrate further includes a touch structure. The touch structure is disposed between the encapsulation layer and the second light guide layer, or on a side of the second light guide layer away from the substrate. A material of the touch structure includes a light-transmissive conductive material.

In some embodiments, an orthographic projection of the touch structure on the substrate is located within a range of an orthographic projection of the second light guide layer on the substrate. The second light guide layer is provided with a plurality of second through holes therein, a material of portions of the touch structure opposite to the plurality of second through holes includes a light-transmissive conductive material.

In another aspect, a display apparatus is provided. The display apparatus includes the display substrate in some embodiments described above.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, but are not limitations on an actual size of a product, and an actual process of a method involved in the embodiments of the present disclosure.

FIG. 1 is an image of a fingerprint texture in the related art;

FIG. 2 is a diagram showing an illuminance distribution of a point light source of a display substrate provided with a polarizer in the related art;

FIG. 3 is a structural diagram of a display substrate, in accordance with some embodiments of the present disclosure;

DETAILED DESCRIPTION

Figure 4:
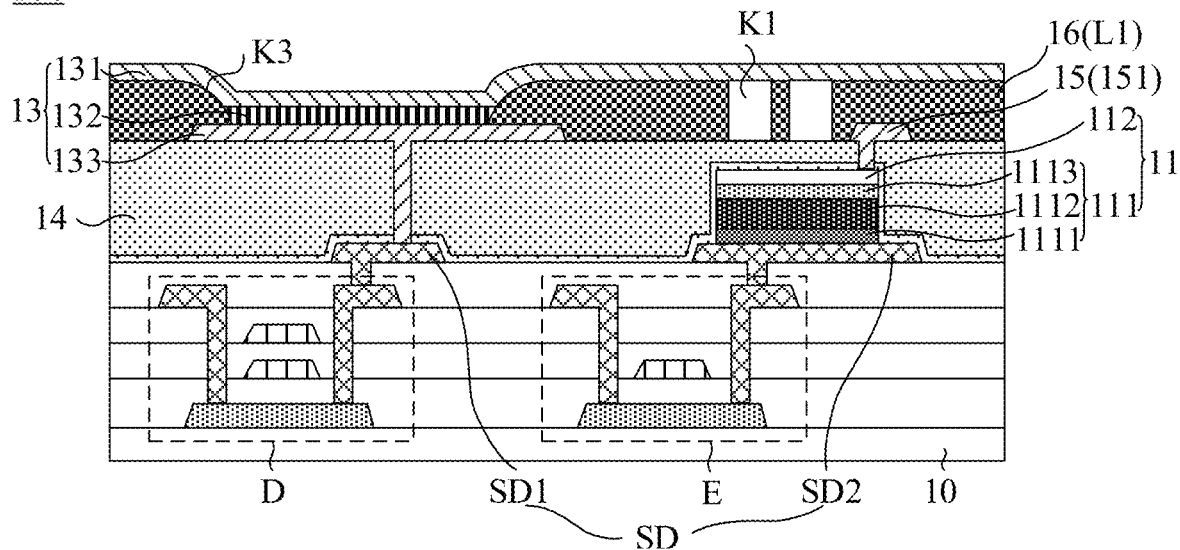
FIG. 4 is a structural diagram of another display substrate, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The expression "A is disposed (or located) on a side of B away from C" not only refers to a positional relationship of the three in space, but also refers to that A is formed after B.

As used herein, the term "if" is optionally construed as "when", "in a case where", "in response to determining", or "in response to detecting" depending on the context. Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, a step, a calculation or other action that is "based on" one or more of the stated conditions or values may, in practice, be based on additional conditions or values exceeding those stated.

As used herein, the terms such as "about" or "approximately" includes a stated value and an average value within an acceptable deviation range of a specific value. The acceptable deviation range is determined by a person of ordinary skill in the art in view of the measurement in question and the error associated with the measurement of a particular quantity (i.e., limitations of the measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In some embodiments, a process of obtaining a fingerprint texture by using an optical fingerprint sensing technology is, for example, such a process that after light is irradiated to a finger, light reflected by ridges (that is, light reflected after being irradiated to the ridges of a fingerprint of the finger) and light reflected by valleys (that is, light reflected after being irradiated to the valleys of the fingerprint of the finger) that have different light intensities are generated; and after the ridge reflection light and the valley reflection light are acquired, an image of the fingerprint texture in black alternating with white may be formed according to the light reflected by the ridges and the light reflected by the valleys.

In the related art, in a process of obtaining an image of a fingerprint texture by using an optical fingerprint sensing technology, an area of the obtained image of the fingerprint texture is small, and an edge of the fingerprint is easily interfered by strong light, which causes the obtained image of the fingerprint texture to be blurred and have low definition (for example, as shown in FIG. 1).

Based on this, some embodiments of the present disclosure provide a display substrate 100. As shown in FIG. 3, the display substrate 100 has a plurality of pixel regions P. The display substrate 100 includes a plurality of sub-pixels Q. Each sub-pixel Q can emit light of a single color such as one of white, red, green and blue. Alternatively, each sub-pixel Q can emit light of other colors, which may be determined according to actual needs here. Image display may be achieved through a cooperation of the plurality of sub-pixels Q with each other.

In some examples, each pixel region P is provided with sub-pixels Q.

The number of the sub-pixels Q provided in each sub-pixel region P may be set according to actual needs. For example, as shown in FIG. 3, three sub-pixels Q are provided in each pixel region P, and the three sub-pixels Q can emit red light, green light and blue light, respectively. For another example, four sub-pixels are provided in each pixel region P. The four sub-pixels Q can emit white light, red light, green light and blue light, respectively. Alternatively, two of the four sub-pixels Q can emit green light, and remaining two sub-pixels Q can emit red light and blue light respectively.

In some examples, as shown in FIGS. 4 to 8, each sub-pixel Q includes a single light-emitting device 13.

For example, as shown in FIGS. 4 to 8, the light-emitting device 13 may include a cathode 131, a light-emitting layer 132 and an anode 133 that are stacked in sequence, and the light-emitting layer 132 can emit colored light. Of course, the light-emitting device 13 may further include an electron injection layer and an electron transport layer that are disposed between the cathode 131 and the light-emitting layer 132, and a hole injection layer and a hole transport layer that are disposed between the anode 133 and the light-emitting layer 132.

A material of the light-emitting layer 132 may be various. For example, the material of the light-emitting layer 132 may include an organic material. In this case, the light-emitting device 13 is an organic light-emitting diode (OLED) device. For example, the material of the light-emitting layer 132 may include a quantum dot material. In this case, the light-emitting device 13 is a quantum dot light-emitting diode (QLED) device.

In some examples, each sub-pixel Q further includes a driving circuit electrically connected to the light-emitting device 13. The driving circuit is configured to provide a driving voltage to the light-emitting device 13, so that the light-emitting device 13 emits light.

For example, as shown in FIGS. 4 to 8, the driving circuit includes a driving transistor D. The driving circuit may be electrically connected to the anode 133 of the light-emitting device 13 through the driving transistor D.

It will be noted that the light-emitting device 13 may also be used as a light source required for obtaining the fingerprint texture. In this way, additional light sources may be omitted, which is beneficial to simplify a structure of the display substrate 100, and thus simplify a manufacturing process of the display substrate 100.

In some embodiments, as shown in FIGS. 4 to 8, the display substrate 100 further includes a substrate 10.

A structure of the substrate 10 is various, which may be determined according to actual needs. For example, the substrate 10 is a blank base substrate. For another example, the substrate 10 includes a blank base substrate and at least one functional film (for example, an insulating layer and/or a buffer layer) disposed on the blank base substrate.

A type of the blank base substrate is various, which may be determined according to actual needs.

For example, the blank base substrate may be a rigid base substrate such as a glass base substrate or a polymethyl methacrylate (PMMA) base substrate.

For another example, the base substrate may be a flexible base substrate such as a polyethylene terephthalate (PET) base substrate, a polyethylene naphthalate (PEN) base substrate or a polyimide (PI) base substrate.

In some embodiments, as shown in FIGS. 4 to 8, the display substrate 100 further includes a plurality of photosensitive sensors 11 disposed on a side of the substrate 10. In a case where the substrate 10 includes the at least one functional film, the plurality of photosensitive sensors 11 are disposed on a side of the at least one functional film away from the blank base substrate.

Here, the light-emitting devices 13 and the plurality of photosensitive sensors 11 are located on a same side of the substrate 10.

In some examples, a relationship between the plurality of photosensitive sensors 11 and the pixel regions P is as follows: each pixel region P is provided with at least one photosensitive sensor 11. That is, each pixel region P is provided with one photosensitive sensor 11 or more photosensitive sensors.

Each photosensitive sensor 11 is configured to acquire light that is emitted by at least one light-emitting device 13 and reflected by a finger. Light acquired by different photosensitive sensors 11 is light reflected by different portions of the finger.

After acquiring the light, the photosensitive sensor 11 may perform photoelectric conversion, and output electrical signals. The display substrate 100 may determine the light acquired by different photosensitive sensors 11 (that is, determine whether the light is the light reflected by the ridges or the light reflected by the valleys) accurately according to electrical signals output by different photosensitive sensors 11, and then integrate and analyze the electrical signals output by the different photosensitive sensors 11 to determine the image of the fingerprint texture, so that an acquisition of the fingerprint texture is achieved.

In some examples, a structure of the photosensitive sensor 11 is various. For example, as shown in FIGS. 4 to 8, the photosensitive sensor 11 includes a semiconductor layer 111 disposed on the side of the substrate 10, and a protective electrode 112 covering a surface of the semiconductor layer 111 away from the substrate 10. As shown in FIGS. 4 to 8, the semiconductor layer 111 includes, for example, an N-type semiconductor layer 1111 (a material thereof is, for example, N-type amorphous silicon), an intrinsic semiconductor layer 1112 (a material thereof is, for example, amorphous silicon) and a P-type semiconductor layer 1113 (a material thereof is, for example, P-type amorphous silicon). Here, the N-type amorphous silicon may be amorphous silicon doped with phosphorus ions, and the P-type amorphous silicon may be amorphous silicon doped with boron ions.

The semiconductor layer 111 can acquire the light that is emitted by the at least one light-emitting device 13 and reflected by the finger, and perform the photoelectric conversion. The protective electrode 112 may protect the surface of the semiconductor layer 111 away from the substrate 10 from being damaged, and thereby prevent performances of the semiconductor layer 111 from being affected.

In some examples, a material of the protective electrode 112 is a light-transmissive conductive material. For example, the material of the protective electrode 112 is indium tin oxide (ITO) or indium doped zinc oxide (IZO). In this way, it may be possible to avoid shielding of light by the protective electrode 112, and prevent such shielding from affecting the acquisition of the light by the semiconductor layer 111.

In some examples, as shown in FIGS. 4 to 8, the display substrate 100 further includes a photosensitive control transistor E disposed on a side of each photosensitive sensor 11 proximate to the substrate 10 and electrically connected to the photosensitive sensor 11.

The photosensitive control transistor E is configured to control electrical signals converted by the photosensitive sensor 11 to be output. That is, when the photosensitive control transistor E is turned on, the photosensitive control transistor E controls the electrical signals converted by the photosensitive sensor 11 to be output through the photosensitive control transistor E.

In some examples, as shown in FIGS. 4 to 8, the photosensitive control transistor E and the driving transistor D may be of a same type. In this way, it is conducive to forming the photosensitive control transistor E and driving transistor D simultaneously, which simplifies the manufacturing process of the display substrate 100.

For example, as shown in FIGS. 4 to 8, both the photosensitive control transistor E and the driving transistor 22 are top-gate thin film transistors. Alternatively, both the photosensitive control transistor E and the driving transistor 22 are bottom-gate thin film transistors.

In addition, a structure of the driving transistor D may be various. For example, the driving transistor D is a single-gate transistor.

In some examples, as shown in FIGS. 4 to 8, the display substrate 100 further includes a source-drain conductive layer SD disposed on a side of the photosensitive control transistor E and the driving transistor D away from the substrate 10. The source-drain conductive layer SD includes a plurality of first conductive patterns SD1 and a plurality of second conductive patterns SD2. Each light-emitting device 13 may be electrically connected to a respective driving transistor D through a single first conductive pattern SD1. Each photosensitive sensor 11 may be electrically connected to a respective photosensitive control transistor E through a single second conductive pattern SD2.

By providing the source-drain conductive layer SD, it is conducive to reducing areas occupied by films disposed on the substrate 10 in space, and facilitates arranging the films.

In some embodiments, as shown in FIGS. 4 to 8, the display substrate further includes a first light guide layer L1 disposed on a side of the plurality of photosensitive sensors 11 away from the substrate 10.

In some examples, as shown in FIGS. 4 to 9, the first light guide layer L1 is provided with a plurality of first through holes K1 therein. A material of the first light guide layer L1 includes a light-shielding material.

The light-shielding material has high light absorptivity. In this way, the first light guide layer L1 can absorb light, and thereby avoid reflection of light incident on the first light guide layer L1.

Figure 10:
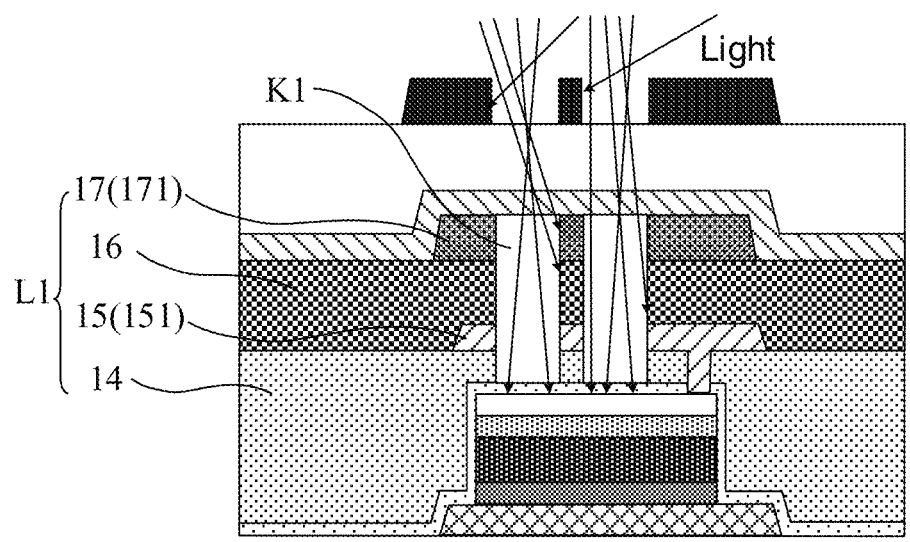
FIG. 10 is a diagram of light paths, in accordance with some embodiments of the present disclosure.

For example, as shown in FIG. 10, as for light entering a certain first through hole K1 in the first light guide layer L1 at different incident angles (for example, including light that is emitted by light-emitting devices 13 and reflected by a finger), a portion of the light (that is, light with large incident angles, for example, including light reflected by a portion of the finger that is not opposite to the first through hole K1) may be directly incident on a side wall of the first through hole K1, and then absorbed by the first light guide layer L1; and another portion of the light (that is, light with small incident angles, for example, including light reflected by a portion of the finger opposite to the first through hole K1) may pass through the first through hole K1, and exit. The another portion of the light is parallel or substantially parallel to each other. In this way, each first through hole K1 may form a collimated light path. As shown in FIG. 10, light passing through the collimated light path is parallel or substantially parallel to each other, and the light may be referred to as collimated light.

In some examples, as shown in FIGS. 4 to 8, an orthogonal projection of at least one first through hole K1 on the substrate 10 is located within a range of an orthographic projection of a photosensitive sensor 11 on the substrate 10.

By setting positions of the first through hole K1 and the photosensitive sensor 11, a portion of light with the large incident angles (this portion of light may be referred to as stray light) may be removed by using the collimated light path formed by the first through hole K1, so that the collimated light (for example, including light reflected by the portion of the finger opposite to the first through hole K1) is obtained. The collimated light is incident on the photosensitive sensor 11, and acquired by the photosensitive sensor 11. In this way, it is conducive to improving accuracy of an obtained image of a fingerprint texture. Moreover, since light acquired by the photosensitive sensors 11 is the collimated light, it may be possible to increase an area of the obtained image of the fingerprint texture.

Therefore, in the display substrate 100 provided in some embodiments of the present disclosure, by providing the first light guide layer L1 having the plurality of first through holes K1 on the side of the plurality of photosensitive sensors 11 away from the substrate 10, each first through hole K1 can form a collimated light path. In this way, in a process of recognizing fingerprints, stray light (for example, carrying information of the fingerprint at a distant position) may be removed by using the collimated light path, which improves the accuracy of the obtained image of the fingerprint texture. Moreover, by using the collimated light path, transmitted light or reflected light generated after external natural light is incident on the finger may also be blocked, which avoids interference of this light on light acquisition, and facilitates improving definition of the obtained image of the fingerprint texture.

In addition, since the light acquired by the photosensitive sensors 11 is the collimated light, it may be possible to increase the area of the obtained image of the fingerprint texture.

In some embodiments, as shown in FIGS. 5 to 8, the display substrate 100 further includes an encapsulation layer 12 disposed on a side of the first light guide layer L1 away from the substrate 10. The encapsulation layer 12 covers the plurality of light-emitting devices 13 and the plurality of photosensitive sensors 11.

In some examples, the encapsulation layer 12 is a thin film encapsulation layer. For example, the thin film encapsulation layer includes a first inorganic layer, an organic layer and a second inorganic layer that are stacked in sequence.

In some examples, a material of the encapsulation layer 12 is a material with a high light transmittance. In this way, it may be possible to avoid affecting display quality of the display substrate 100, and avoid affecting the photosensitive sensors 11 to acquire the light reflected by the finger.

By providing the encapsulation layer 12, the light-emitting devices 13 may be blocked from moisture and oxygen by using the encapsulation layer 12, which avoids erosion of external moisture and/or external oxygen on the light-emitting devices 13, thereby preventing performances of the display substrate 100 being affected.

In some embodiments, as shown in FIGS. 5 to 8, the display substrate 100 further includes a second light guide layer L2 disposed on a side of the encapsulation layer 12 away from the substrate 10. The second light guide layer L2 is configured such that light passing through the second light guide layer L2 is light at an exit angle within a preset range.

A structure of the second light guide layer L2 is various, which may be determined according to actual needs.

In some examples, a material of the second light guide layer L2 includes a light-shielding material. The second light guide layer L2 is provided with a plurality of second through holes K2 therein.

The light-shielding material has high light absorptivity. In this way, the second light guide layer L2 can absorb light, and thereby avoid reflection of light incident on the second light guide layer L2.

For example, as shown in FIG. 10, as for light entering a certain second through hole K2 in the second light guide layer L2 at different incident angles (for example, including the light that is emitted by the light-emitting devices 13 and reflected by the finger), a portion of the light (that is, light with large incident angles, for example, including light reflected by a portion of the finger that is not opposite to the second through hole K2) may be directly incident on a side wall of the second through hole K2, and then absorbed by the second light guide layer L2; and another portion of the light (that is, light with small incident angles, for example, including light reflected by a portion of the finger opposite to the second through hole K2) may pass through the second through hole K2, and exit. The another portion of the light is parallel or substantially parallel to each other.

Based on this, the preset range of the exit angle of the light passing through the second light guide layer L2 may be set according to diameters of the second through holes K2 and a thickness of the second light guide layer L2.

For example, as shown in FIGS. 5 to 9, a relationship between the first through holes K1 in the first light guide layer L1 and the second through holes K2 in the second light guide layer L2 may be as follows: an orthogonal projection of a first through hole K1 on the substrate 10 at least partially overlaps with an orthogonal projection of a second through hole K2 on the substrate 10. Here, in a case where the number of the first through holes K1 is the same as the number of the second through holes K2, the first through holes K1 may be in a one-to-one correspondence with the second through holes K2. In this case, an orthogonal projection of each first through hole K1 on the substrate 10 at least partially overlaps with an orthogonal projection of a second through hole K2 corresponding to the first through hole K1 on the substrate 10.

For example, the orthogonal projection of each first through hole K1 on the substrate 10 partially overlaps with the orthogonal projection of the respective second through hole K2 on the substrate 10. In this case, each first through hole K1 may be partially staggered with the second through hole K2 corresponding thereto in space, and diameters of the first through hole K1 and the second through hole K2 corresponding thereto may be set according to actual needs, as long as each first through hole K1 is well aligned with the second through hole K2 corresponding thereto.

For another example, the orthogonal projection of each first through hole K1 on the substrate 10 coincides with the orthogonal projection of the second through hole K2 corresponding to the first through hole K1 on the substrate 10. In this case, an area of the orthogonal projection of each first through hole K1 on the substrate 10 is equal to an area of the orthogonal projection of the second through hole K2 corresponding thereto on the substrate 10. That is, a diameter of each first through hole K1 is equal to a diameter of the second through hole K2 corresponding thereto, so that each first through hole K1 is relatively well aligned with the second through hole K2 corresponding thereto.

By setting the relationship between the orthogonal projection of each first through hole K1 on the substrate 10 and the orthogonal projection of the second through hole K2 corresponding thereto on the substrate 10, and separating the first light guide layer L1 from the second light guide layer L2 by using the encapsulation layer 12, a certain distance exists between each first through hole K1 and the second through hole K2 corresponding thereto, so that each first through hole K1 and the second through hole K2 corresponding thereto together form a collimated light path with a good collimation effect.

A thickness of the encapsulation layer 12 (that is, a dimension of the encapsulation layer 12 in a direction perpendicular to the substrate 10) may be set according to actual needs.

For example, the thickness of the encapsulation layer 12 (for example, a maximum thickness, a minimum thickness or an average thickness) is within a range of 6 μm to 12 μm, inclusive. In this way, on the basis of separating the first light guide layer L1 from the second light guide layer L2, it may be possible to ensure that each first through hole K1 and the second through hole K2 corresponding thereto can form the collimated light path.

For example, the thickness of the encapsulation layer 12 may be 6 μm, 7 μm, 8.5 μm, 10 μm, 11 μm, or 12 μm.

For example, as shown in FIGS. 5 to 8, an orthogonal projection of at least one first through hole K1 on the substrate 10 and an orthogonal projection of at least one second through hole K2 on the substrate 10 are located within an orthographic projection of a single photosensitive sensor 11 on the substrate 10.

For example, the at least one first through hole K1 is in a one-to-one correspondence with the at least one second through hole K2.

By setting positions of the first through hole K1, the second through hole K2 and the photosensitive sensor 11, a portion of light with large incident angles (this portion of light may be referred to as stray light) may be removed by using the collimated light path formed by the first through hole K1 and the second through hole K2, so that collimated light (for example, including light reflected by the portion of the finger that is opposite to the second through hole K2) is obtained. The collimated light is incident onto the corresponding photosensitive sensor 11, and acquired by the photosensitive sensor 11. In this way, it is conducive to further improving the accuracy of the obtained image of the fingerprint texture. Moreover, since the light acquired by the photosensitive sensor 11 is the collimated light, it may be possible to further increase the area of the obtained image of the fingerprint texture.

In some other examples, the second light guide layer L2 may be a prismatic lens, and a surface of the prismatic lens is provided with a plurality of microprism structures. The second light guide layer L2 can converge the light passing therethrough.

In this way, after the light passing through the second light guide layer L2 is converged by using the second light guide layer L2, the first light guide layer L1 may serve to filter the converged light, so that light incident on the photosensitive sensors 11 is parallel or substantially parallel to each other.

Here, the preset range of the exit angle of the light passing through the second light guide layer L2 may be set according to dimensions of the plurality of microprism structures.

In some embodiments, 2 to 100 first through holes K1 are provided in a portion of the first light guide layer L1 covering each photosensitive sensor 11. That is, orthogonal projections of the 2 to 100 first through holes K1 on the substrate 10 are located within an orthographic projection of a single photosensitive sensor 11. Correspondingly, in a case where the second light guide layer L2 includes the plurality of second through holes K2, orthogonal projections of 2 to 100 second through holes K2 on the substrate 10 are located within an orthographic projection of a single photosensitive sensor 11.

Figure 11:
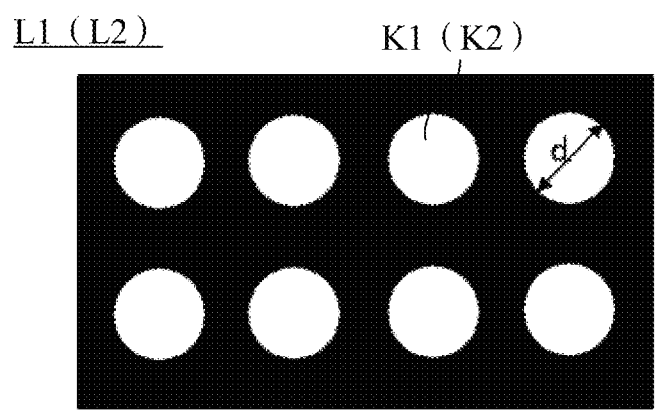
FIG. 11 is a partial top view of a first light guide layer or a second light guide layer, in accordance with some embodiments of the present disclosure.

In some examples, as shown in FIG. 11, a diameter d of each first through hole K1 is within a range of 2 μm to 10 μm, inclusive. For example, the diameter d of each first through hole K1 is 2 μm, 3 μm, 5 μm, 7 μm, or 10 μm. Correspondingly, a diameter d of each second through hole K2 is within a range of 2 μm to 10 μm, inclusive.

Here, in a case where a large number of first through holes K1 are provided in the portion of the first light guide layer L1 covering each photosensitive sensor 11, the diameter d of each first through hole K1 may be small. In a case where a small number of first through holes K1 are provided in the portion of the first light guide layer L1 covering each photosensitive sensor 11, the diameter d of each first through hole K1 may be large. In this way, each photosensitive sensor 11 may acquire enough light, which ensures high definition and high accuracy of the obtained image of the fingerprint texture.

In some examples, as shown in FIG. 11, a distance between every two adjacent first through holes K1 may be within a range of 1 μm to 5 μm, inclusive. For example, the distance between every two adjacent first through holes K1 is 1 μm, 2 μm, 3 μm, 4 μm or 5 μm. In this way, it may not only be possible to avoid increasing difficulties in a process of forming the first through holes K1, but also facilitate setting the number and an arrangement of the first through holes K1. Correspondingly, a distance between every two adjacent second through holes K2 may be within a range of 1 μm to 5 μm, inclusive.

In some embodiments, as shown in FIGS. 4 to 8, the display substrate 100 further includes a planarization layer 14, an electrode layer 15 and a pixel defining layer 16 that are sequentially disposed on the side of the plurality of photosensitive sensors 11 away from the substrate 10.

In some examples, as shown in FIGS. 4 to 8, the electrode layer 15 includes a plurality of electrode patterns 151. The plurality of electrode patterns 151 are electrically connected to the plurality of photosensitive sensors 11 in a one-to-one correspondence. Each electrode pattern 151 is configured to provide a voltage signal (for example, a bias voltage signal) to a respective photosensitive sensor 11.

Here, the voltage signal provided by each electrode pattern 151 cooperates with a respective photosensitive control transistor E to control the electrical signals converted by the respective photosensitive sensor 11 to be output through the respective photosensitive control transistor E.

In some examples, as shown in FIGS. 4 to 8, an anode 133 of each light-emitting device 13 and the electrode layer 15 may be disposed in a same layer and disposed on a side of the planarization layer 14 away from the substrate 10. In this way, the planarization layer 14 may be used for flattening, so that topography of the anodes 133 and the electrode layer 15 is relatively flat.

The "same layer" mentioned herein refers to a layer structure, which is formed by forming a film layer for obtaining specific patterns through a same film-forming process and then performing a single patterning process by using a mask. Depending on different specific patterns, the single patterning process may include several exposure, development or etching processes, the specific patterns in the formed layer structure may be continuous or discontinuous, and these specific patterns may also be at different heights or have different thicknesses. In this way, the anodes 133 and the electrode layer may be formed simultaneously, which simplifies the manufacturing process of the display substrate 100.

In some examples, as shown in FIGS. 4 to 8, the pixel defining layer 16 has a plurality of first openings K3, and each first opening K3 is provided with a light-emitting layer 132 of a single light-emitting device 13. Alternatively, the light-emitting layer 132 may extend beyond the first opening K3, and be disposed on a surface of the pixel defining layer 16 away from the substrate 10, but be non-overlapping with an adjacent light-emitting layer 132.

In addition, a cathode 131 of each light-emitting device 13 may be disposed in a single first opening K3. Alternatively, as shown in FIGS. 4 to 8, cathodes 131 of the plurality of light-emitting devices 13 may be of an integrated structure disposed on a side of the pixel defining layer 16 away from the substrate 10.

In some examples, the first light guide layer L1 includes at least one of the planarization layer 14, the electrode layer 15 and the pixel defining layer 16. That is, the at least one of the planarization layer 14, the electrode layer 15 and the pixel defining layer 16 is provided with the plurality of first through holes K1, and a material of the at least one of the planarization layer 14, the electrode layer 15 and the pixel defining layer 16 includes a light-shielding material.

It will be noted that a material of the electrode layer 15 may be a conductive material (for example, a metal material) having a low light transmittance. As shown in FIGS. 4 to 8, in a case where the first light guide layer L1 does not include the electrode layer 15 (that is, the plurality of first through holes K1 do not penetrate the electrode layer 15), an orthographic projection of each photosensitive sensor 11 on the substrate 10 partially overlaps with an orthographic projection of the electrode layer 15 on the substrate (that is, the orthographic projection of each photosensitive sensor 11 on the substrate partially overlaps with an orthographic projection of a respective electrode pattern 151 on the substrate 10), and orthographic projections of the plurality of first through holes K1 on the substrate 10 are non-overlapping with the orthographic projection of the electrode layer 15 on the substrate 10. In this way, it may be possible to avoid shielding of light incident to the photosensitive sensors 11, and prevent such shielding from affecting the obtaining of the image of the fingerprint texture.

Figure 9:
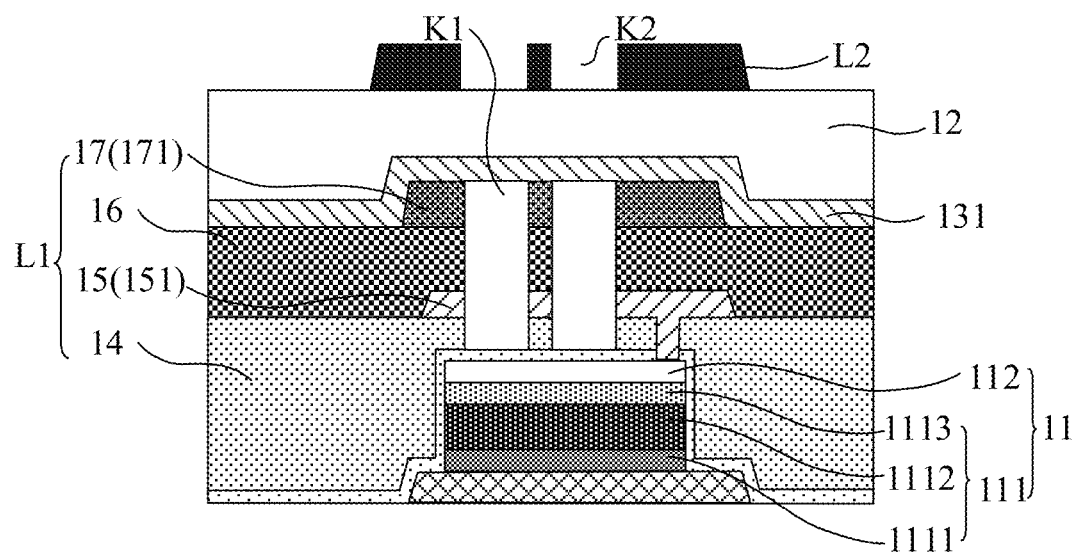
FIG. 9 is a partial structural diagram of a display substrate, in accordance with some embodiments of the present disclosure.

Here, as shown in FIG. 9, in a case where the first light guide layer L1 includes the electrode layer 15, and the plurality of first through holes K1 penetrate the electrode layer 15, the orthographic projection of each photosensitive sensor 11 on the substrate is located within a range of an outer border of an orthographic projection of a portion, facing the photosensitive sensor 11, of the electrode layer 15 on the substrate 10, i.e., within a range of an outer border of the orthographic projection of the respective electrode pattern 151 on the substrate 10. In this way, it may be possible to ensure that the plurality of second through holes K2 in the second light guide layer L2 are capable of forming collimated light paths with the plurality of first through holes K1 penetrating the electrode layer 15.

Figure 6:
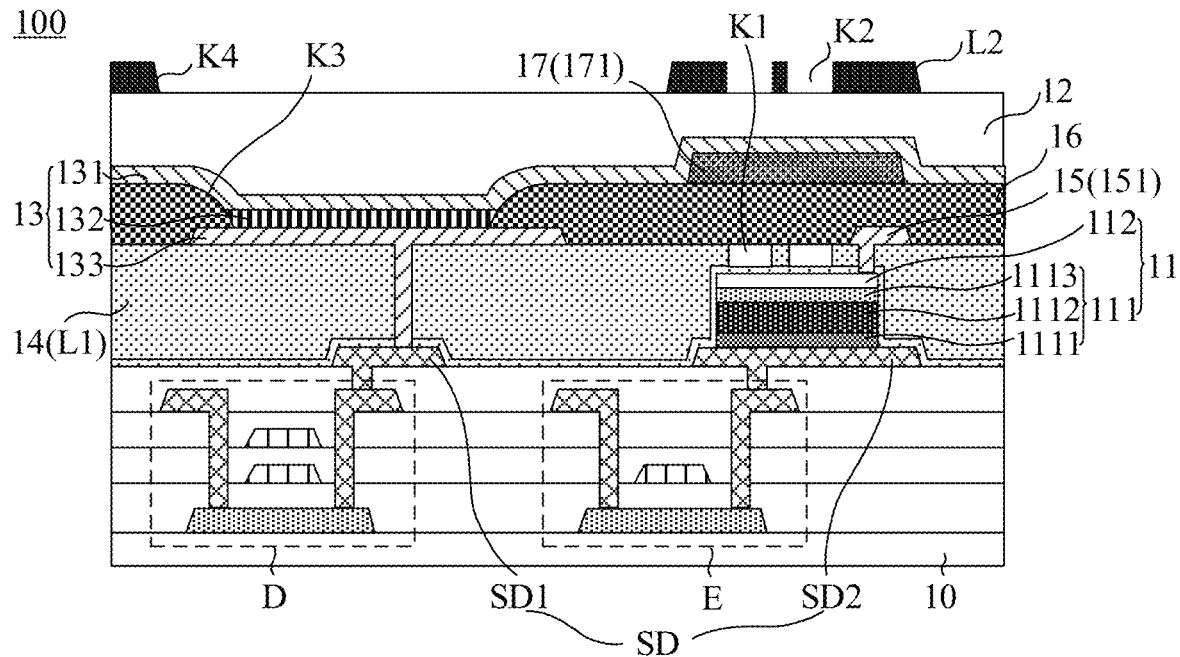
FIG. 6 is a structural diagram of still another display substrate, in accordance with some embodiments of the present disclosure.
Figure 7:
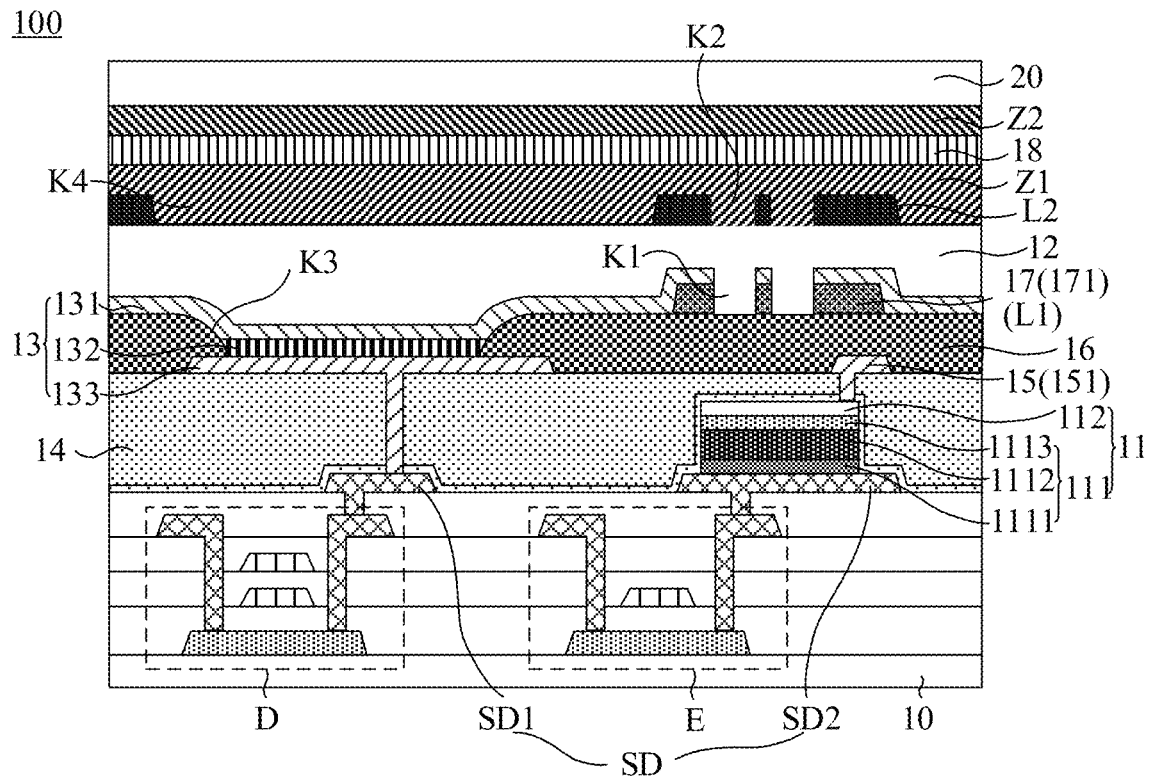
FIG. 7 is a structural diagram of still another display substrate, in accordance with some embodiments of the present disclosure.
Figure 8:
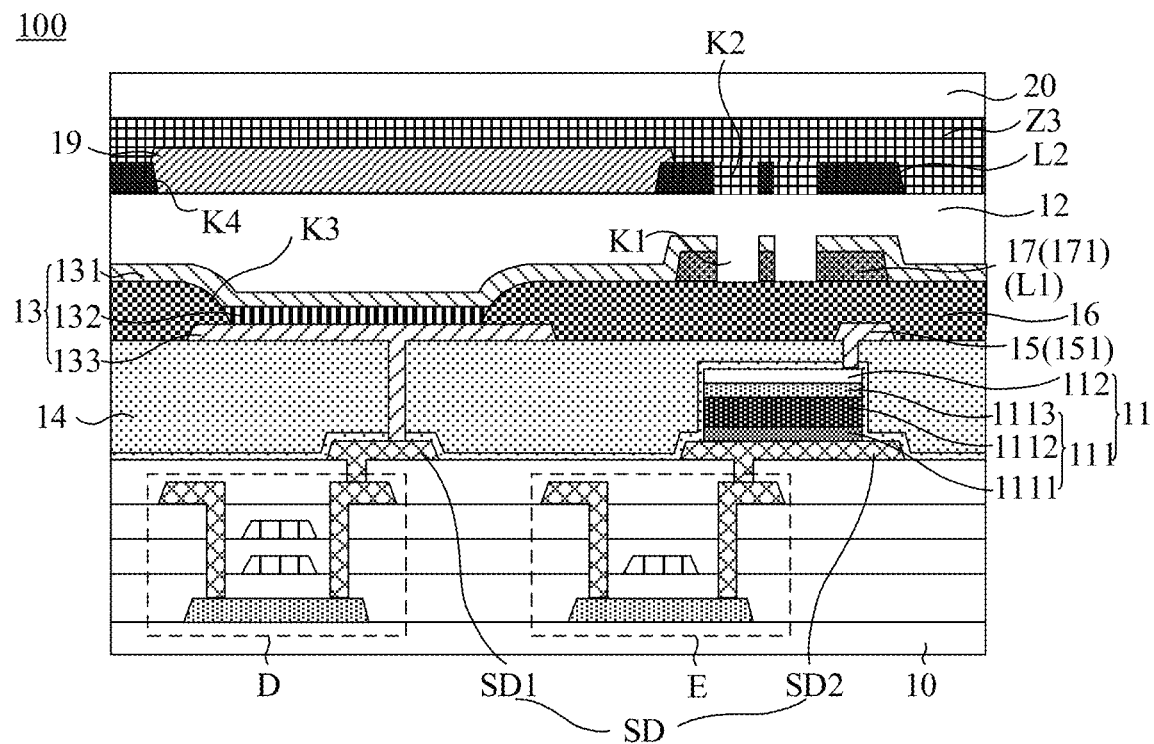
FIG. 8 is a structural diagram of still another display substrate, in accordance with some embodiments of the present disclosure.

In some embodiments, as shown in FIGS. 6 to 8, the display substrate 100 further includes a spacer layer 17 disposed on the side of the pixel defining layer 16 away from the substrate 10.

Here, it will be noted that, in a case where the material of the light-emitting layer 132 of the light-emitting device 13 includes the organic material, and the light-emitting layer 132 is formed by an evaporation process (i.e., in the process of forming the light-emitting layer 132, the spacer layer 17 is located under layers of the display substrate 100 that has been formed), the spacer layer 17 may serve to support the display substrate 100, so as to prevent the display substrate 100 from being damaged.

In some examples, as shown in FIGS. 6 to 8, the spacer layer 17 includes a plurality of spacers 171. An orthographic projection of each spacer 171 on the substrate is located within a range of an orthographic projection of the pixel defining layer 16 on the substrate 10. That is, orthographic projections of the spacers 171 on the substrate 10 are non-overlapping with orthogonal projections of the first openings K3 on the substrate 10. In this way, on the basis of using the spacer layer 17 to support the display substrate 100, it may be possible to prevent the first openings K3 from being blocked by the spacers 171, thereby avoiding adverse effects on the evaporation process of forming the light-emitting layer 132 of the light-emitting device 13.

Figure 5:
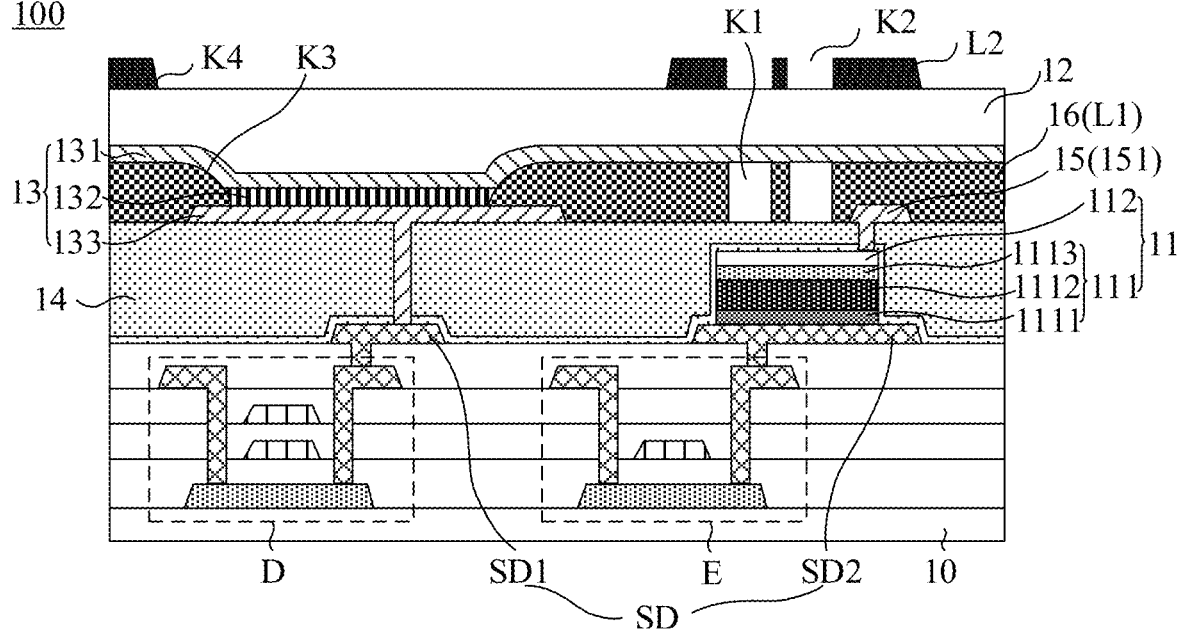
FIG. 5 is a structural diagram of still another display substrate, in accordance with some embodiments of the present disclosure.

In some examples, the first light guide layer L1 includes at least one of the planarization layer 14, the electrode layer 15, the pixel defining layer 16 and the spacer layer 17. For example, as shown in FIGS. 4 and 5, the first light guide layer L1 includes the pixel defining layer 16; as shown in FIG. 6, the first light guide layer L1 includes the planarization layer 14; as shown in FIGS. 7 and 8, the first light guide layer L1 includes the spacer layer 17; and as shown in FIG. 9, the first light guide layer L1 includes the planarization layer 14, the electrode layer 15, the pixel defining layer 16 and the spacer layer 17.

Based on this, the orthographic projection of each photosensitive sensor 11 on the substrate 10 is located within a range of an orthographic projection of the spacer layer 17 on the substrate 10.

In some examples, the number of the photosensitive sensors 11 is equal to the number of the spacers 171 included in the spacer layer 17, and the photosensitive sensors 11 are in a one-to-one correspondence with the spacers 171. The orthographic projection of each photosensitive spacer 11 on the substrate 10 is located within a range of an orthographic projection of a respective spacer 171 on the substrate 10. In this way, in a case where the first light guide layer L1 includes the spacer layer 17, it may be possible to ensure that the second through holes K2 in the second light guide layer L2 are capable of forming the collimate light paths with the first through holes K1 provided in the plurality of spacers 171.

In some embodiments, in a case where the first light guide layer L1 includes the at least one of the planarization layer 14, the pixel defining layer 16 and the spacer layer 17, the light-shielding material of the first light guide layer L1 includes, for example, a light-shielding resin material. For example, the light-shielding resin material may be acrylic resin doped with black pigments (for example, carbon) or black resin (for example, a material formed by doping carbon, titanium or nickel in photoresist).

In addition, in a case where at least one of the planarization layer 14, the pixel defining layer 16 and the spacer layer 17 is not included in the first light guide layer L1, a material of the first light guide layer L1 is, for example, a material having a high light transmittance (for example, a transparent resin material or a transparent inorganic material). In this way, it may be possible to avoid adverse effects on the light incident to the photosensitive sensors 11.

In some embodiments, the plurality of first through holes K1 in the first light guide layer L1 are filled with a light-transmissive material.

In some examples, the light-transmissive material filled in the plurality of first through holes K1 is a portion of a film on the side of the first light guide layer L1 away from the substrate 10.

For example, in a case where the first light guide layer L1 is the planarization layer 14, the light-transmissive material filled in the plurality of first through holes K1 is a portion of the pixel defining layer 16.

For example, as shown in FIGS. 7 and 8, in a case where the first light guide layer L1 is the spacer layer 17, the light-transmissive material filled in the plurality of first through holes K1 is a portion of the encapsulation layer 12. Here, the cathodes 131 are connected into an integrated structure; and in a process of forming the cathodes 131 on a side of the spacer layer 17 away from the substrate 10, the breaches will be generated at positions where the plurality of first through holes K1 are located in the integrated structure, and the portion of the encapsulation layer 12 may sink into and fill the plurality of first through holes K1 at the positions.

In this way, it may be possible to omit an additional light-transmissive material used for filling the plurality of first through holes K1, and then omit an additional process of filling the additional light-transmissive material in the plurality of first through holes K1, which facilitates simplifying the manufacturing process of the display substrate 100.

In some examples, the first light guide layer L1 includes the planarization layer 14, the pixel defining layer 16 and the spacer layer 17. In this case, the plurality of first through holes K1 may be formed by a same patterning process (for example, exposure and development), and the plurality of first through holes K1 all penetrate the planarization layer 14, the pixel defining layer 16 and the spacer layer 17. In this way, it is conducive to simplifying the manufacturing process of the display substrate 100.

In some examples, as shown in FIGS. 5 to 8, an orthographic projection of the second light guide layer L2 on the substrate 10 is located within the range of the orthographic projection of the pixel defining layer 16 on the substrate 10. That is, the orthographic projection of the second light guide layer L2 on the substrate 10 is non-overlapping with an orthographic projection of a light-emitting layer 132 of each light-emitting device 13 on the substrate 10.

In some examples, the light-shielding material of the second light guide layer L2 includes a light-shielding resin material or a chromium metal. The light-shielding resin material may be, for example, acrylic resin doped with black pigments (for example, carbon), or black resin (for example, a material formed by doping carbon, titanium or nickel in photoresist).

Since the material of the second light guide layer L2 can absorb light, by setting a positional relationship between the second light guide layer L2 and the light-emitting layers 132, it may be possible to prevent light emitted by the light-emitting layer 132 from being absorbed before the light exits out of a display surface of the display substrate 100, thereby avoiding affecting a display effect of the display substrate 100.

In some examples, as shown in FIGS. 5 to 8, the second light guide layer L2 has a plurality of second openings K4 therein. For example, the second light guide layer L2 has a grid-like structure similar to the pixel defining layer 16.

In some examples, as shown in FIGS. 5 to 8, orthogonal projections of the plurality of second openings K4 on the substrate 10 are non-overlapping with orthographic projections of the plurality of photosensitive sensors 11 on the substrate 10. This means that, the second light guide layer L2 covers the plurality of photosensitive sensors 11. In this way, it is conducive to locating the orthogonal projections, on the substrate 10, of the plurality of second through holes K2 in the second light guide layer L2 within a range of the orthographic projections of the plurality of photosensitive sensors 11 on the substrate 10, so as to ensure that an orthogonal projection of a collimated light path formed by each second through hole K2 and a respective first through hole K1 is located within the range of the orthographic projections of the plurality of photosensitive sensors 11 on the substrate 10.

In some examples, the plurality of second openings K4 are in a one-to-one correspondence with the plurality of first openings K3. The orthogonal projections of the plurality of second openings K4 on the substrate 10 coincide with orthogonal projections of the plurality of first openings K3 on the substrate 10. Alternatively, an orthogonal projection of each first opening K3 on the substrate 10 is located within a range of an orthogonal projection of the respective second opening K4 on the substrate 10. In this way, it may be possible to avoid adverse effects on a light-emitting effect of the display substrate 100.

In some embodiments, as shown in FIGS. 7 and 8, the display substrate 100 further includes a protective substrate 20 disposed on a side of the second light guide layer L2 away from the substrate 10.

The protective substrate 20 may be, for example, a glass substrate, and configured to protect films disposed on the substrate 10.

In some embodiments, as shown in FIG. 7, the display substrate 100 further includes a polarizer 18 disposed on the side of the second light guide layer L2 away from the substrate 10. The polarizer 18 may be disposed between the second light guide layer L2 and the protective substrate 20.

By providing the polarizer 18, it may be possible to reduce reflection of natural light off the display substrate 100, which improves the display effect of the display substrate 100.

Based on this, as shown in FIG. 7, the display substrate 100 further includes: a first bonding layer Z1 disposed between the polarizer 18 and the second light guide layer L2, and a second bonding layer Z2 disposed between the polarizer 18 and the protective substrate 20.

Here, the first bonding layer Z1 is configured to bond the polarizer 18 to the second light guide layer L2. The second bonding layer Z2 is configured to bond the polarizer 18 to the protective substrate 20. A material of each of first bonding layer Z1 and the second bonding layer Z2 may be, for example, acrylic glue.

In some other embodiments, as shown in FIG. 8, the display substrate 100 further includes a color filter portion 19 disposed in each second opening K4.

Since the plurality of second openings K4 are in a one-to-one correspondence with the plurality of first openings K3, it means that the plurality of second openings K4 are in a one-to-one correspondence with the light-emitting layers 132 in the plurality of first openings K3.

For example, a color of light allowed to pass through the color filter portion 19 in each second opening K4 is the same as a color of light emitted by the respective light-emitting layer 132. For example, a plurality of light-emitting layers 132 include light-emitting layers capable of emitting red light, light-emitting layers capable of emitting green light, and light-emitting layers capable of emitting yellow light. Accordingly, a plurality of color filters portions 19 include red color filter portions, green filter portions and yellow filter portions.

By providing the color filter portion 19 on a side of each light-emitting layer 132 away from the substrate 10, and setting a color of light emitted by each light-emitting layer 132 to be same as a color of light allowed to pass through the respective color filter portion 19, it may be possible to filter out a large portion of light by using the color filter portion 19 when natural light is incident on the display substrate 100, and a small portion of the light entering the inside of the display substrate 100 may be further consumed under an action of films inside the display substrate 100. In a case where the small portion of the light is not completely consumed and exits out of the display substrate 100 through color filter portions 19, it may be possible to ensure that a color of light exiting out of the display substrate 100 is the same as a color of light emitted by a respective light-emitting device 13. In this way, not only may reflection of natural light off the display substrate 100 be effectively reduced, which improves the display effect of the display substrate 100, but also light extraction efficiency of the display substrate 100 may be improved, which reduces power consumption of the display substrate 100.

In addition, by providing the color filter portion 19 on the side of each light-emitting layer 132 away from the substrate 10, it may further be possible to avoid a phenomenon of uneven illuminance distribution of the image of the fingerprint texture (for example, as shown in FIG. 2), so that the image of the fingerprint texture as a whole may be clear and easy to be distinguished.

In some examples, in a case where the second light guide layer L2 and the plurality of color filter portions 19 are both disposed on a side of the encapsulation layer 12 away from the substrate 10, the second light guide layer L2 may also be used as a black matrix, and the structure of the display substrate 100 may be referred to as a color filter on encapsulation (COE) structure.

Based on this, as shown in FIG. 8, the display substrate 100 further includes a third bonding layer Z3 disposed between the second light guide layer L2 and the protective substrate 20. The third bonding layer Z3 covers the color filter portion 19 disposed in each second opening K4 in the second light guide layer L2.

Here, the third bonding layer Z3 is configured to bond the second light guide layer L2 to the protective substrate 20, and bond the color filter portions 19 to the protective substrate 20. A material of third bonding layer Z3 may be, for example, acrylic glue.

In some embodiments, the plurality of second through holes K2 in the second light guide layer L2 are filled with a light-transmissive material. By using the light-transmissive material, it may be possible to avoid adverse effects on light transmission.

Figure 12:
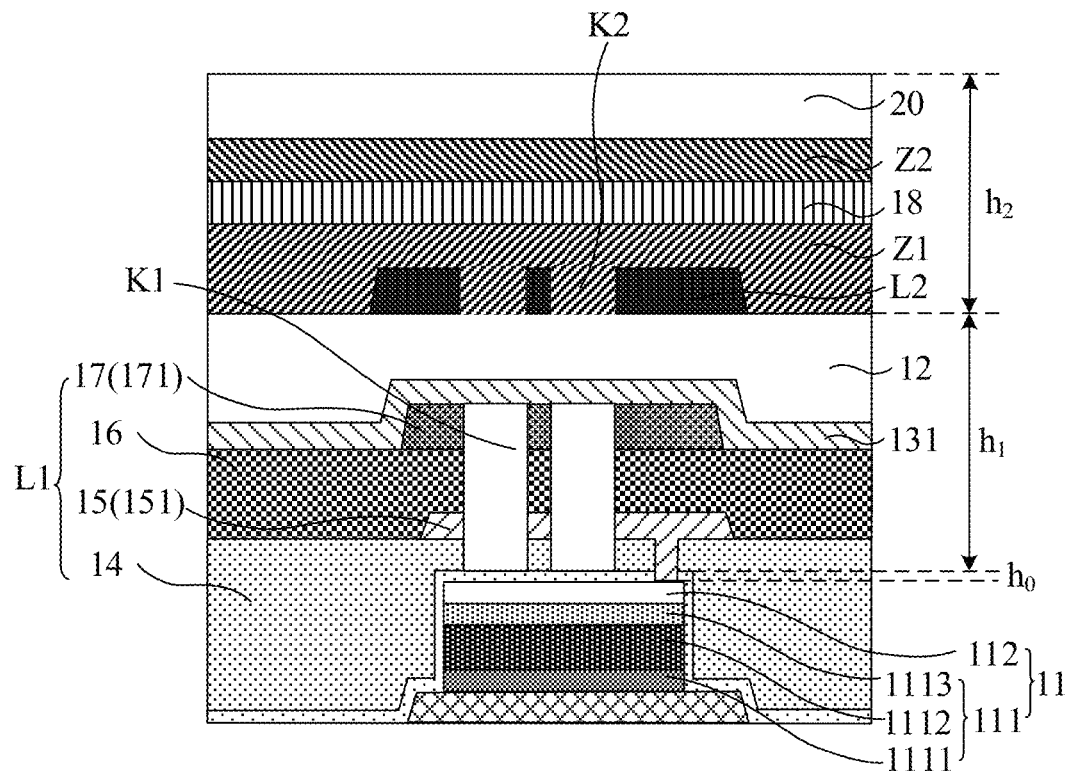
FIG. 12 is a partial structural diagram of another display substrate, in accordance with some embodiments of the present disclosure.

In some examples, as shown in FIGS. 7 and 12, in a case where the display substrate 100 further includes the polarizer 18, the light-transmissive material may be a portion of the first bonding layer Z1. That is, in a process of forming the first bonding layer Z1, the portion of the first bonding layer Z1 may naturally sink into and fill the plurality of second through holes K2.

Figure 14:
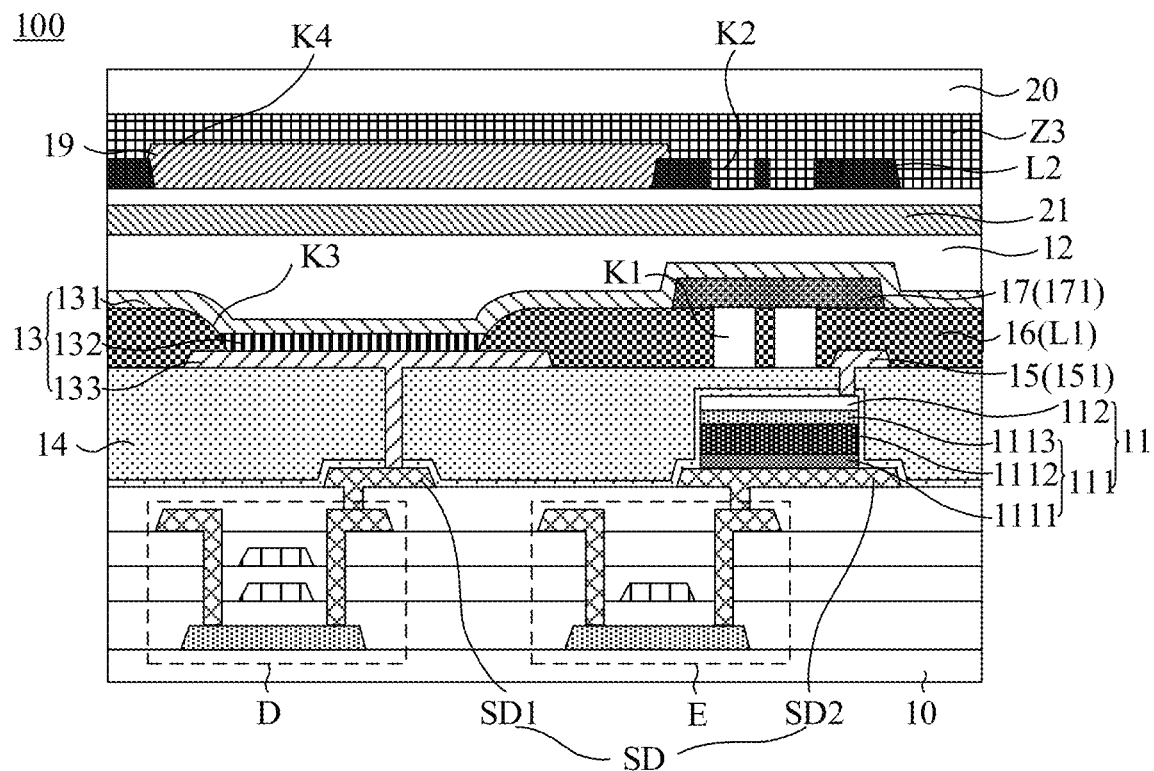
FIG. 14 is a structural diagram of still another display substrate, in accordance with some embodiments of the present disclosure.

In some other examples, as shown in FIGS. 8 and 14, in a case where the display substrate 100 further includes the color filter portions 19, the light-transmissive material may be a portion of the third bonding layer Z3. That is, in a process of forming the third bonding layer Z3, the portion of the third bonding layer Z3 may naturally sink into and fill the plurality of second through holes K2.

In this way, it may be possible to omit an additional light-transmissive material used for filling the plurality of second through holes K2, and then omit an additional process of filling the additional light-transmissive material in the plurality of second through holes K2, which is conducive to simplifying the manufacturing process of the display substrate 100.

In some embodiments, different portions of the display substrate 100 may have certain thickness (that is, a dimension thereof in the direction perpendicular to the substrate 10) requirements, and thicknesses of the different portions may be set according to actual needs.

In some examples, as shown in FIG. 12, a minimum distance $h_0$ between a surface of the photosensitive sensor 11 away from the substrate 10 and the first light guide layer L1 is within a range of 0.5 μm to 5 μm, inclusive. That is, the distance $h_0$ is a thickness of a film located between the photosensitive sensor 11 and the first light guide layer L1.

For example, the distance $h_0$ may be 0.5 μm, 1 μm, 2 μm, 3 μm, 4 μm, or 5 μm.

In some examples, as shown in FIG. 12, a minimum distance $h_1$ between the second light guide layer L2 and the film located between the photosensitive sensor 11 and the first light guide layer L1 is within a range of 6 μm to 20 μm, inclusive.

For example, the distance $h_1$ is 6 μm, 9 μm, 12 μm, 15 μm, 18 μm, or 20 μm.

In some examples, as shown in FIG. 12, a distance $h_2$ from a surface of the second light guide layer L2 away from the protective substrate 20 to a surface of the protective substrate 20 away from the second light guide layer L2 is within a range of 300 μm to 1000 μm, inclusive. The distance $h_2$ is a sum of the thickness of the second light guide layer L2, a thickness of the protective substrate 20, and thicknesses of thin film(s) (for example, the second bonding layer Z2 or the polarizer 18) disposed between the second light guide layer L2 and the protective substrate 20.

For example, the distance $h_2$ is 300 μm, 500 μm, 700 μm, 800 μm, 900 μm, or 1000 μm.

By setting the distances $h_0$, $h_1$ and $h_2$ in the above manner, it is beneficial to ensure that the collimated light paths in the display substrate 100 have a good effect of forming collimated light, and avoid a great increase in a thickness of the display substrate 100.

The following description will take an optical simulation test as an example to schematically illustrate the image of the fingerprint texture obtained by the display substrate 100 provided in the embodiments of the present disclosure.

For example, the distance $h_0$ is set to 1 μm; the distance $h_1$ is set to 18 μm; the distance $h_2$ is set to 600 μm; diameters of the first through holes K1 and the second through holes K2 are each set to 8 μm, and the distance between two adjacent first through holes K1 and the distance between two adjacent second through holes K2 are each set to 4 μm (that is, a hole pitch between two adjacent first through holes K1 and a hole pitch between two adjacent second through holes K2 are each 12 μm); and a single photosensitive sensor 11 is provided in each pixel region P.

Figure 13:
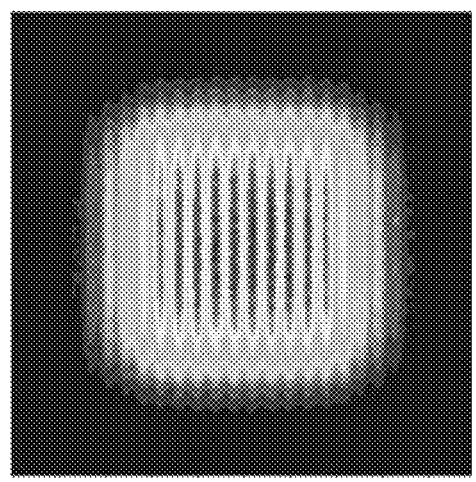
FIG. 13 is a schematic diagram of an image of a fingerprint texture, in accordance with some embodiments of the present disclosure.

A result of the optical simulation test is as shown in FIG. 13. As can be seen in the figure, the fingerprint texture is clearly visible as a whole, and there is no phenomenon that it is difficult to determine such as blurring or partial indistinctness.

Therefore, in the embodiments of the present disclosure, by adjusting materials of existing films of the display substrate 100, providing through holes in the films after the materials of the films are adjusted so as to form the light collimating paths, and setting different portions of the display substrate 100 to have specific thicknesses, it may be possible to increase the area of the image of the fingerprint texture, and improve the overall clarity of the image of the fingerprint texture, so as to improve recognition performance of the display substrate 100 on the image of the fingerprint texture.

Figure 15:
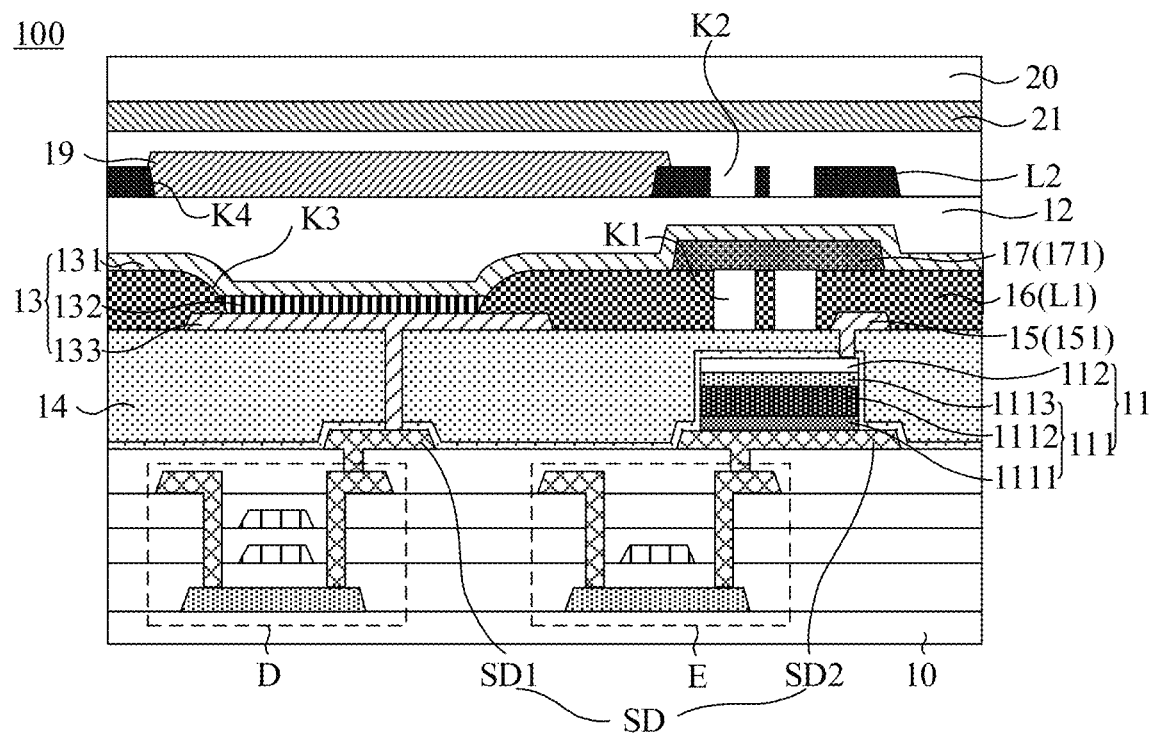
FIG. 15 is a structural diagram of still another display substrate, in accordance with some embodiments of the present disclosure.

In some embodiments, as shown in FIGS. 14 and 15, the display substrate 100 further includes a touch structure 21. In this way, the display substrate 100 may not only have a fingerprint recognition function, but also have a touch function, so as to realize an integration of a plurality of functions.

A position of the touch structure 21 is various, which may be determined according to actual needs.

In some examples, as shown in FIG. 14, the touch structure 21 is disposed between the encapsulation layer 12 and the second light guide layer L2. In this case, this structure may be referred to as an on-cell touch (that is, the touch structure 21 is disposed on the encapsulation layer 12). In this way, it is beneficial to reduce the thickness of the display substrate 100, and achieve a light and thin design of the display substrate 100.

Here, an orthographic projection of the touch structure 21 on the substrate 10 may be located within the range of the orthographic projection of the second light guide layer L2 on the substrate 10. In this way, it may be possible to avoid adverse effects on the display effect and display quality of the display substrate 100.

A structure of the touch structure 21 is various, which may be determined according to actual needs.

Figure 16:
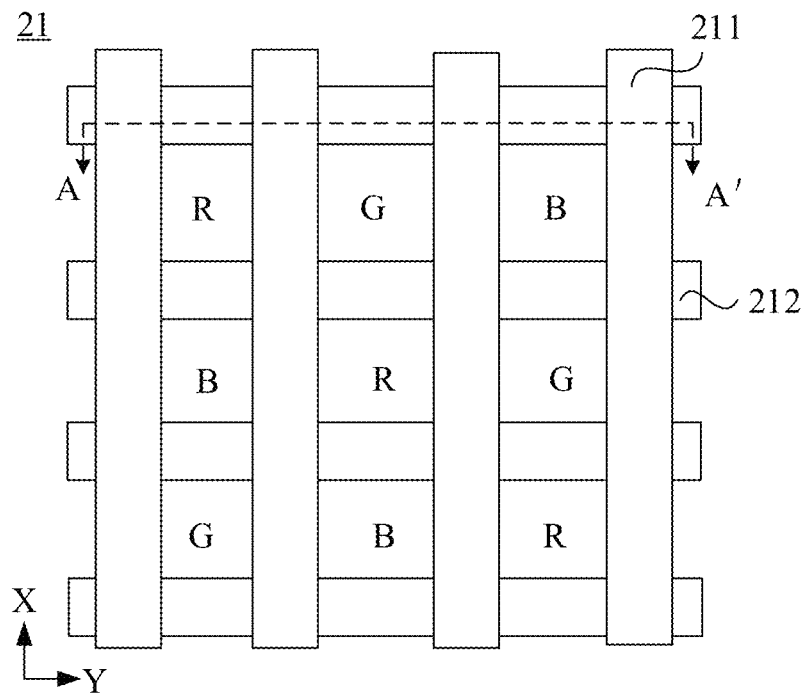
FIG. 16 is a structural diagram of a touch structure, in accordance with some embodiments of the present disclosure.
Figure 17:
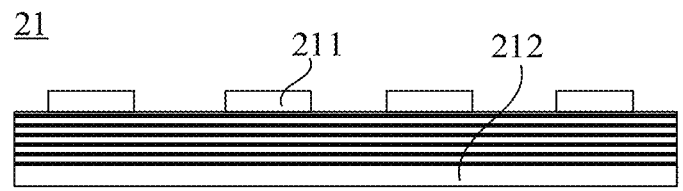
FIG. 17 is a sectional view of the touch structure shown in FIG. 16 in the direction A-A'.

For example, as shown in FIGS. 16 and 17, the touch structure 21 includes a plurality of first touch electrodes 211 disposed on the side of the encapsulating layer 12 away from the substrate 10, and a plurality of second touch electrodes 212 disposed on a side of the plurality of first touch electrodes 211 away from the substrate 10. The plurality of first touch electrodes 211 extend along a first direction X, and are spaced apart from each other. The plurality of second touch electrodes 212 extend along a second direction Y, and are spaced apart from each other. The plurality of first touch electrodes 211 and the plurality of second touch electrodes 212 are insulated from each other. The first direction X intersects the second direction Y.

Figure 18:
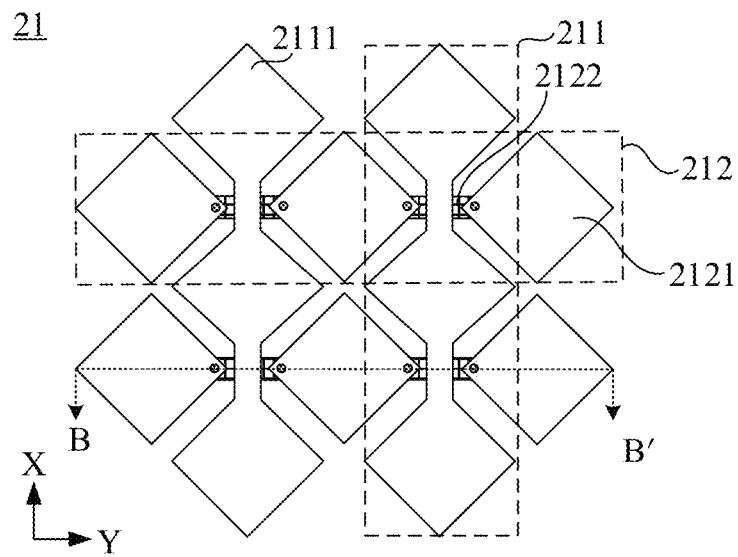
FIG. 18 is a structural diagram of another touch structure, in accordance with some embodiments of the present disclosure.
Figure 19:
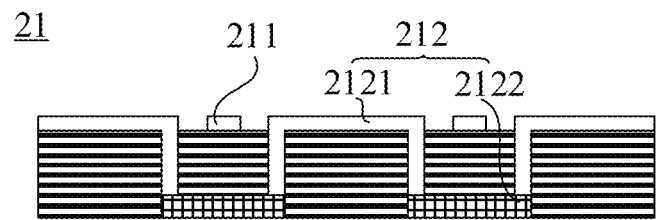
FIG. 19 is a sectional view of the touch structure shown in FIG. 18 in the direction B-B'.

For another example, as shown in FIGS. 18 and 19, the touch structure 21 includes a plurality of conductive bridges 2122 disposed on the side of the encapsulation layer 12 away from the substrate 10. The conductive bridges 2122 are arranged, for example, in an array.

The touch structure 21 further includes a plurality of first touch electrodes 211 disposed on a side of the plurality of conductive bridges 2122 away from the substrate 10. The plurality of first touch electrodes 211 extend along a first direction X. Each first touch electrode 211 includes a plurality of first touch sub-electrodes 2111 connected in series. Each first touch electrode 211 is of, for example, an integrated structure.

The touch structure 21 further includes a plurality of rows of second touch sub-electrodes 2121 disposed in a same layer as the plurality of first touch electrodes 211. Each row of second touch sub-electrodes 2121 includes a plurality of second touch sub-electrodes 2121 spaced apart from each other in a second direction Y. In each row of second touch sub-electrodes 2121, every two adjacent second touch sub-electrodes 2121 are electrically connected to a single conductive bridge 2122, so that the plurality of second touch sub-electrodes 2121 and the plurality of conductive bridges 2122 constitute a plurality of second touch electrodes 212.

By arranging the plurality of first touch electrodes 211 and the plurality of rows of second touch sub-electrodes 2121 in the same layer, it may be possible to form the plurality of first touch electrodes 211 and the plurality of rows of second touch sub-electrodes 2121 simultaneously, which is conducive to simplifying the manufacturing process of the display substrate 100.

A material of the touch structure 21 is various.

For example, the material of the touch structure 21 includes a light-transmissive conductive material. For example, the light-transmissive conductive material is ITO or IZO. In this way, it may be possible to prevent the light incident to the photosensitive sensors 11 from being blocking by the touch structure 21, thereby avoiding adverse effects on propagation of the light.

Figure 20:
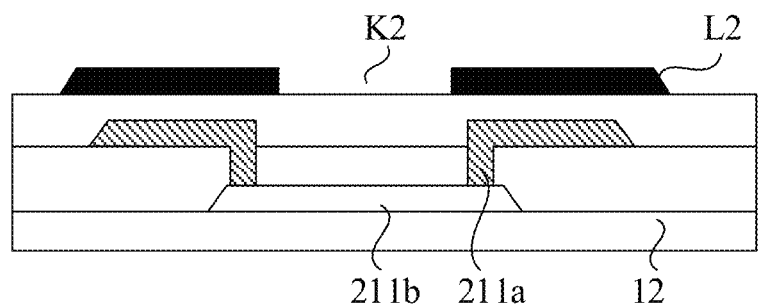
FIG. 20 is partial structural diagram of a touch structure and a second light guide layer, in accordance with some embodiments of the present disclosure.

For another example, as shown in FIG. 20, a material of portions of the touch structure 21 opposite to the plurality of second through holes K2 in the second light guide layer L2 includes a light-transmissive conductive material. In this case, of the touch structure 21, portions not opposite to the plurality of second through holes K2 in the second light guide layer L2 may be in connect with the portions of the touch structure 21 opposite to the plurality of second through holes K2 in the second light guide layer L2 through via holes, so as to form an electrical connect.

As shown in FIG. 20, considering an example where a portion of a first touch electrode 211 of the touch structure 21 is opposite to a second through hole K2, portions 211a of the first touch electrode 211 that are not opposite to the second through hole K2 are electrically connected to a portion 211b of the first touch electrode 211 that is opposite to the second through hole K2 through via holes.

Here, the light-transmissive conductive material of the portions of the touch structure 21 opposite to the plurality of second through holes K2 in the second light guide layer L2 is, for example, ITO or IZO. A material of the portions that are not opposite to the plurality of second through holes K2 in the second light guide layer L2 is, for example, molybdenum (Mo) or aluminum (Al). In this way, it may be possible to prevent the light incident to the photosensitive sensors 11 from being blocked, and the touch structure 21 may have a small resistance, which prevents accuracy of touch signals in the touch structure 21 from being affected.

In some other examples, as shown in FIG. 15, the touch structure 21 is disposed on the side of the second light guide layer L2 away from the substrate 10. For example, the touch structure 21 is disposed between the second light guide layer L2 and the protective substrate 20. In this case, this structure may be referred to as an out-cell touch. In this way, it is conducive to simplifying the manufacturing process of the display substrate 100.

For example, the touch structure 21 in this example adopts the same structure and materials as the touch structure 21 in some examples described above, which will not be detailed here.

Figure 21:
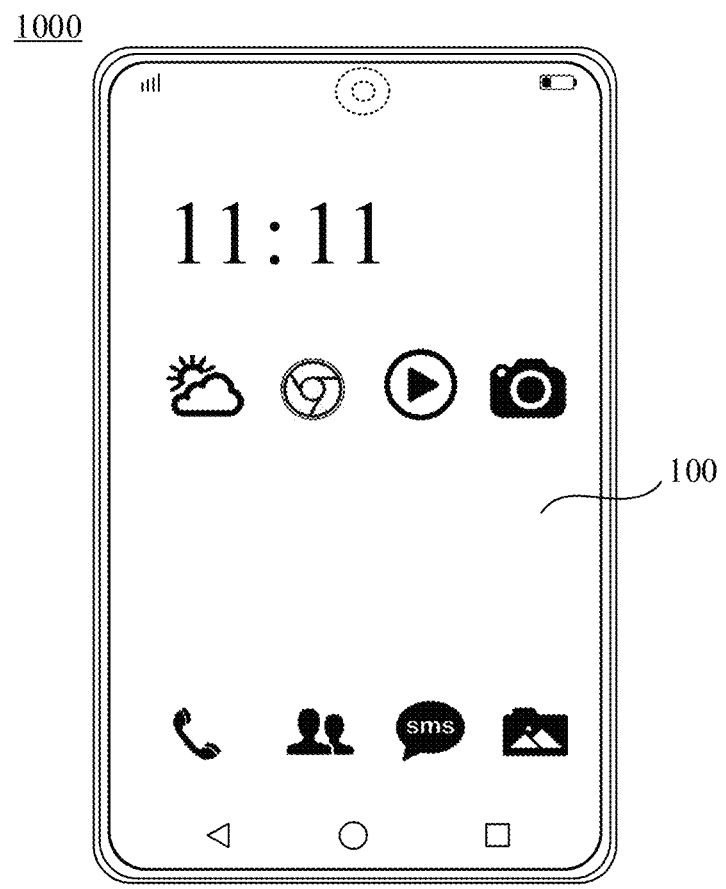
FIG. 21 is a structural diagram of a display apparatus, in accordance with some embodiments of the present disclosure.

Some embodiments of the present disclosure provide a display apparatus 1000. As shown in FIG. 21, the display apparatus 1000 includes the display substrate 100 as provided in some embodiments described above.

The display substrate 100 included in the display apparatus 1000 has the same structure and beneficial effects as the display substrate 100 provided in some embodiments described above, which will not be detailed here.

In some examples, the display apparatus 1000 further includes a housing for installing the display substrate 100, and/or camera(s) installed on the display substrate 100, etc.

In some embodiments, the display apparatus 1000 is any product or component having a display function, such as a mobile phone, a tablet computer, a television, a monitor, a notebook computer, a digital frame or a navigator.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, having a plurality of sub-pixels, comprising:
   a substrate;
   driving transistors disposed on a side the substrate;
   a plurality of photosensitive sensors disposed on a side of the driving transistors away from the substrate;
   light-emitting devices disposed on a side of the plurality of photosensitive sensors away from the substrate; and
   a first light guide layer disposed on a side of the plurality of photosensitive sensors away from the substrate; wherein
   each sub-pixel includes a driving transistor of the driving transistors and a light-emitting device of the light-emitting devices, and the driving transistor is electrically connected to the light-emitting device;
   a material of the first light guide layer includes a light-shielding material; and
   the first light guide layer is provided with a plurality of first through holes therein, and an orthogonal projection of at least one first through hole on the substrate is located within a range of an orthographic projection of a photosensitive sensor of the plurality of photosensitive sensors on the substrate,
   wherein 2 to 100 first through holes of the plurality of first through holes are provided in a portion, facing each photosensitive sensor, of the first light guide layer; and orthogonal projections of the 2 to 100 first through holes on the substrate are spaced apart from each other,
   wherein the display substrate further comprises a planarization layer, an electrode layer, a pixel defining layer and a spacer layer that are sequentially disposed on the side of the plurality of photosensitive sensors away from the substrate; the first light guide layer includes the planarization layer, the electrode layer, the pixel defining layer and the spacer layer; the plurality of first through holes penetrate the planarization layer, the electrode layer, the pixel defining layer and the spacer layer; and an outer border of an orthographic projection of each photosensitive sensor on the substrate is located within each of orthographic projections of the planarization layer, the electrode layer, the pixel defining layer and the spacer layer on the substrate,
   wherein the display substrate further comprises an encapsulation layer disposed on a side of the first light guide layer away from the substrate and a second light guide layer disposed on a side of the encapsulation layer away from the substrate,
   wherein a material of the second light guide layer includes a light-shielding material; the second light guide layer is provided with a plurality of second through holes therein; an orthogonal projection of a first through hole of the plurality of first through holes on the substrate at least partially overlaps with an orthogonal projection of a respective second through hole of the plurality of second through holes on the substrate; and the orthogonal projection of the first through hole and the orthogonal projection of the respective second through hole are within a range of an orthographic projection of a same photosensitive sensor on the substrate.

2. The display substrate according to claim 1, wherein the orthographic projection of each photosensitive sensor on the substrate is located within a range of an outer border of an orthographic projection of a portion, facing the photosensitive sensor, of the electrode layer on the substrate.

3. The display substrate according to claim 1, wherein the light-emitting device includes a light-emitting layer; the pixel defining layer has a plurality of first openings, and each first opening is provided with a light-emitting layer of the light-emitting layers therein; and each photosensitive sensor is configured to acquire light that is emitted by at least one light-emitting device and reflected by a finger.

4. The display substrate according to claim 3, wherein the spacer layer includes a plurality of spacers; an orthographic projection of each spacer on the substrate is located within a range of an orthographic projection of the pixel defining layer on the substrate; and an orthographic projection of the photosensitive sensor on the substrate is located within a range of an orthographic projection of a respective one of the plurality of spacers on the substrate.

5. The display substrate according to claim 1, wherein a diameter of a first through hole of the 2 to 100 first through holes is within a range of 2 μm to 10 μm, inclusive.

6. The display substrate according to claim 1, an orthographic projection of the second light guide layer on the substrate being located within a range of an orthographic projection of the pixel defining layer on the substrate.

7. The display substrate according to claim 1, wherein the plurality of first through holes and the plurality of second through holes are each filled with a light-transmissive material.

8. The display substrate according to claim 1, wherein a thickness of the encapsulation layer is within a range of 6 μm to 12 μm, inclusive.

9. The display substrate according to claim 1, wherein
the second light guide layer is provided with a plurality of second openings therein, and an orthogonal projection of each second opening on the substrate is non-overlapping with an orthographic projection of any one of the plurality of photosensitive sensors on the substrate; and
the display substrate further comprises a color filter portion disposed in each second opening.

10. The display substrate according to claim 1, further comprising: a polarizer disposed on a side of the second light guide layer away from the substrate.

11. The display substrate according to claim 1, further comprising: a touch structure, the touch structure being disposed between the encapsulation layer and the second light guide layer, or on a side of the second light guide layer away from the substrate; and
a material of the touch structure including a light-transmissive conductive material.

12. The display substrate according to claim 11, wherein
an orthographic projection of the touch structure on the substrate is located within a range of an orthographic projection of the second light guide layer on the substrate; and
a material of portions of the touch structure opposite to the plurality of second through holes includes a light-transmissive conductive material.

13. A display apparatus, comprising the display substrate according to claim 1.

* * * * *